(12) United States Patent
Ngo et al.

(10) Patent No.: US 12,325,140 B2
(45) Date of Patent: Jun. 10, 2025

(54) GRIP-BASED TRANSPORT SPEEDS FOR TRANSPORTING OBJECTS AT A MANUFACTURING SYSTEM

(71) Applicant: APPLIED MATERIALS, INC., Santa Clara, CA (US)

(72) Inventors: Khai T. Ngo, Austin, TX (US); Michelle A. Wong, Fremont, CA (US); Helder Lee, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 565 days.

(21) Appl. No.: 17/683,137

(22) Filed: Feb. 28, 2022

(65) Prior Publication Data

US 2023/0271321 A1 Aug. 31, 2023

(51) Int. Cl.
| | | |
|---|---|---|
| B25J 9/16 | (2006.01) | |
| B25J 11/00 | (2006.01) | |
| B25J 13/08 | (2006.01) | |
| B25J 15/00 | (2006.01) | |
| B25J 15/06 | (2006.01) | |
| H01L 21/677 | (2006.01) | |

(Continued)

(52) U.S. Cl.
CPC ........... *B25J 9/1694* (2013.01); *B25J 9/1651* (2013.01); *B25J 11/0095* (2013.01); *B25J 13/08* (2013.01); *B25J 15/0014* (2013.01); *B25J 15/0616* (2013.01); *B25J 15/0683* (2013.01); *H01L 21/677* (2013.01); *H01L 21/6838* (2013.01); *H01L 21/68707* (2013.01)

(58) Field of Classification Search
CPC .... B25J 9/1694; B25J 9/1651; B25J 11/0095; B25J 13/08; B25J 15/0014; B25J 15/0616; B25J 15/0683; B25J 9/1612; H01L 21/677; H01L 21/6838; H01L 21/68707; H01L 21/67259; G05B 2219/45031

See application file for complete search history.

(56) References Cited

U.S. PATENT DOCUMENTS 9,343,350 B2    5/2016  Arai
2011/0160897 A1*  6/2011  Shimomura ........... B25J 9/1692
                                                 700/217

(Continued)

OTHER PUBLICATIONS

PCT International Search Report and Written Opinion for International Application No. PCT/US2023/013859 mailed Jun. 19, 2023, 11 pages.

*Primary Examiner* — Thomas Randazzo
(74) *Attorney, Agent, or Firm* — Lowenstein Sandler LLP (57) ABSTRACT

Systems and methods for grip-based transport speeds for objects transported at a manufacturing system is provided. A controller can detect an object placed on an end effector of a robot arm. The controller can apply vacuum pressure to secure the object to the end effector via vacuum grip pads. The controller can obtain a vacuum pressure measurement indicating the amount of vacuum pressure between the object and the end effector and determine whether the obtained vacuum pressure measurement satisfies a vacuum pressure criterion. The controller can determine a transport speed setting for transporting the object using the robot arm based on whether the obtained vacuum pressure measurement satisfies the vacuum pressure criterion. The controller can cause the robot arm to move the object according to the transport speed setting.

20 Claims, 5 Drawing Sheets

(51) Int. Cl.
*H01L 21/683* (2006.01)
*H01L 21/687* (2006.01)

(56) References Cited

U.S. PATENT DOCUMENTS

| | | | |
|---|---|---|---|
| 2013/0294877 A1* | 11/2013 | Hosek | B25J 15/0014 |
| | | | 414/800 |
| 2014/0119856 A1 | 5/2014 | Duhamel et al. | |
| 2014/0316572 A1 | 10/2014 | Iwatake | |
| 2015/0044008 A1* | 2/2015 | Tseng | B25J 11/0095 |
| | | | 414/800 |
| 2018/0272535 A1* | 9/2018 | Ogawa | B25J 13/085 |
| 2020/0376659 A1 | 12/2020 | Diankov et al. | |
| 2021/0173390 A1* | 6/2021 | Hosek | G05B 23/0221 |
| 2021/0178579 A1* | 6/2021 | Saunders | B25J 15/0052 |

* cited by examiner

Apply vacuum pressure to a space between a object and an end effector of a robot arm to secure the object to the end effector 410

Move the object within a manufacturing system via the end effector according to an initial transport speed setting 412

Detect that the vacuum pressure between the space between the object and the end effector fails to satisfy a vacuum pressure criterion 414

Move the object within the manufacturing system via the end effector according to an updated transport speed setting 416

GRIP-BASED TRANSPORT SPEEDS FOR TRANSPORTING OBJECTS AT A MANUFACTURING SYSTEM

TECHNICAL FIELD

Embodiments of the present disclosure relate, in general, to a manufacturing system and more particularly to grip-based transport speeds for transporting objects at a manufacturing system.

BACKGROUND

One or more robots at a manufacturing system can transport objects (e.g., substrates, process kits, etc.) between stations of the manufacturing system (e.g., process chamber, transfer chamber, load lock, factory interface, etc.). For instance, a substrate can be placed on an end effector of a robot arm of a robot and the robot can transport the substrate between one or more stations of the manufacturing system via the robot arm. In some systems, a substrate can be secured to the end effector via a vacuum pressure provided to a space between the substrate and the end effector. The vacuum pressure can be provided via one or more vacuum grip pads of the end effector that are connected to a vacuum pressure source (e.g., a vacuum pump) via one or more vacuum lines (e.g., fed through the robot arm of the robot). In some instances, a vacuum grip pad, a vacuum line, and/or a vacuum pressure source for an end effector can be defective or otherwise unable to provide vacuum pressure to the space between a substrate and an end effector. In other or similar instances, the object (e.g., a substrate) can be warped or otherwise deformed such that the object does not interface with each vacuum grip pad of the end effector. Accordingly, the object may not be adequately secured to the end effector and can fall or become otherwise dislodged from the end effector during transport of the substrate within the manufacturing system. The object and/or other equipment of the manufacturing system can become damaged.

SUMMARY

Some embodiments described cover a manufacturing system including a robot arm. The robot arm includes an end effector and is configured to transport objects within the manufacturing system. The system can also include a controller operatively coupled to the robot arm. The controller is to detect a presence of an object placed on the end effector of the robot arm. The controller is further to apply vacuum pressure to a space between the object and the end effector via one or more vacuum grip pads of the end effector. The vacuum pressure is applied to secure the object to the end effector. The controller is further to obtain, by one or more pressure sensors of the robot arm, a vacuum pressure measurement indicating an amount of vacuum pressure between the object and the end effector. The controller is further to determine whether the obtained vacuum pressure measurement satisfies a vacuum pressure criterion. The controller is further to determine a transport speed setting for transporting the object using the robot arm based on whether the obtained vacuum pressure measurement satisfies the vacuum pressure criterion. The controller is further to cause the robot arm to move the object according to the transport speed setting.

In some embodiments, a method includes detecting a presence of an object placed on an end effector of a robot arm. The method further includes applying vacuum pressure to a space between the object and the end effector via one or more vacuum grip pads of the end effector. The vacuum pressure is applied to secure the object to the end effector. The method further includes obtaining, by one or more pressure sensors of the robot arm, a vacuum pressure measurement indicating an amount of vacuum pressure between the object and the end effector. The method further includes determining whether the obtained vacuum pressure measurement satisfies a vacuum pressure criterion. The method further includes determining a transport speed setting for transporting the object using the robot arm based on whether the obtained vacuum pressure measurement satisfies the vacuum pressure criterion. The method further includes causing the robot arm to move the object according to the transport speed setting.

In some embodiments, a robot arm for a manufacturing system includes an end effector. The end effector includes one or more vacuum grip pads configured to apply a vacuum to a space between the vacuum grip pads and an object to secure the object to the end effector. The end effector further includes a detector to detect a presence of the object on the end effector. The detector can include an optical sensor and/or a capacitance sensor. The end effector can further include a pressure sensor to measure a pressure of the space between the one or more vacuum grip pads and the substrate. The robot arm can be configured to move according to a first motion profile responsive to the pressure of the space between the vacuum grip pads and the substrate satisfying a pressure criterion and to move according to a second motion profile responsive to the pressure of the space between the vacuum grip pads and the object failing to satisfy the pressure criterion.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Embodiments descried herein are related to methods and systems for grip-based transport speeds for transporting objects at a manufacturing system. A manufacturing system can include one or more robots that is configured to transport objects (e.g., substrates, process kits, diagnostic wafers, cover wafers, etc.) throughout the manufacturing system.

For example, a transfer chamber robot can be configured to transport objects between a process chamber, a transfer chamber, a load lock, and so forth. In another example, a factory interface robot can be configured to transport substrates between a substrate carrier, a factory interface, a load lock, and so forth. A robot of a manufacturing system can include a robot arm, which can include one or more end effectors. An object can be placed (or otherwise disposed) on the end effector and the robot can move the substrate throughout one or more portions of the manufacturing system via the end effector. For example, a processing device associated with the robot (e.g., a system controller for the manufacturing system) can cause the robot arm to move the end effector and the substrate from a first position relative to a first station of the manufacturing system to a second position relative to a second station of the manufacturing system (e.g., according to a process recipe, etc.).

An end effector can include one or more vacuum grip pads that are configured to apply a vacuum pressure to a space between the substrate and the end effector. The vacuum grip pads can be connected to a vacuum pressure source (e.g., a vacuum pump) via one or more vacuum supply lines (e.g., fed through the robot arm of the robot). The vacuum pressure source can generate vacuum pressure (e.g., in response to an instruction or signal from the system controller) and the generated vacuum pressure can be provided to the vacuum grip pads via the vacuum supply lines. The vacuum grip pads can be configured to supply the vacuum pressure to the space between the object and the end effector. When the vacuum pressure is provided to the space between the object and the end effector, a vacuum force is applied to the object, which can secure the substrate to the end effector.

In some instances, a one or more of the vacuum grip pads of the end effector, one or more of the vacuum lines and/or the vacuum pressure source can be defective or can otherwise become damaged. In other or similar instances, an object (e.g., a substrate) can become warped or otherwise deformed such that the object does not interface with the vacuum grip pads of the end effector. Accordingly, the vacuum grip pads may not provide a sufficient amount of vacuum pressure to the space between the object and the end effector to adequately secure the object to the end effector during transport. In one illustrative example, the end effector can include multiple vacuum grip pads and one of the multiple vacuum grip pads can become defective. In such example, the other vacuum grip pad(s) may secure one portion of the substrate to the end effector, but the defective grip pad may fail to secure another portion of the substrate to the end effector. Accordingly, during transport of the substrate within the manufacturing system, the unsecured portion of the substrate may become dislodged from the defective vacuum grip pad and the secured portion of the substrate may rotate around an axis relative to the non-defective vacuum grip pad. Such rotation can cause damage to the substrate, the end effector, and/or other equipment of the manufacturing system. In another illustrative example, the vacuum line(s) and/or the vacuum pressure source can become defective or otherwise fail to provide adequate vacuum pressure to the vacuum grip pads. Accordingly, no portions of the substrate may be secured to the end effector and the substrate may fall from the end effector during transport within the manufacturing system. The substrate falling from the end effector can cause damage to the substrate, the end effector, and/or other equipment of the manufacturing system. As a significant number of objects can become unsecured from the end effector and potentially damaged, an overall throughput of the manufacturing system can be significantly decreased. Additionally, it can take a significant amount of time and resources to repair an end effector and/or other equipment of the manufacturing system, which can further reduce an overall throughput and overall efficiency of the manufacturing system, while increasing an overall latency of the manufacturing system.

Embodiments disclosed herein are directed towards grip-based transport speeds for transporting objects at a manufacturing system. An object (e.g., a substrate, a process kit, etc.) can be placed (or otherwise disposed) on an end effector of a robot arm for a robot at a manufacturing system. The end effector can include one or more vacuum grip pads and, in some embodiments, a presence sensor. The vacuum grip pads can be configured to provide a vacuum pressure between a space between a substrate and the end effector to secure the substrate to the end effector. The presence sensor can be configured to detect a presence of the substrate on the end effector. The vacuum grip pads can be connected to a vacuum pressure source (e.g., a vacuum pump) via one or more vacuum pressure lines (also referred to as vacuum lines herein). The vacuum lines and/or the vacuum grip pads can be connected to one or more pressure sensors. The one or more pressure sensors can be configured to measure an amount of vacuum pressure provided by the vacuum pressure source to the one or more vacuum grip pads. The amount of vacuum pressure provided by the vacuum pressure source can correspond to the amount of vacuum pressure provided by the vacuum grip pads to the space between an object and an end effector, in some embodiments.

A controller for the manufacturing system (referred to as a system controller herein) can detect the presence of the substrate placed on the end effector. In some embodiments, the system controller can detect the presence of the substrate based on a reading from the presence sensor. The system controller can transmit a signal to the vacuum pressure source to cause the vacuum pressure source to generate vacuum pressure. The vacuum grip pads can receive the vacuum pressure from the vacuum pressure source via the vacuum lines and can provide the vacuum pressure to the space between the end effector and the substrate. In some embodiments, the one or more pressure sensors of the robot arm can generate one or more measurements indicating the amount of vacuum pressure provided between the substrate and the end effector. The system controller can receive the generated measurement(s) and can determine whether the measurement(s) satisfy a vacuum pressure criterion. For example, the criterion can correspond to a threshold vacuum pressure. The system controller can determine whether the measured vacuum pressure meets or exceeds the threshold vacuum pressure to determine whether the measurement(s) satisfy the criterion.

In response to determining that the measured vacuum pressure does not satisfy the criterion, the system controller can cause the robot arm to move the substrate within the manufacturing system via the end effector according to a first transport speed. The first transport speed can be slow enough such that the substrate is secured to the end effector based on a frictional force between the substrate and the one or more vacuum grip pads. In response to determining that the measured vacuum pressure satisfies the criterion, the system controller can cause the robot arm to move the substrate within the manufacturing system according to a second transport speed that is faster than the first transport speed. The second transport speed can be a default transport speed associated with the manufacturing system.

Embodiments of the present disclosure address the above mentioned deficiencies by providing techniques for grip-based transport speeds for transporting objects at a manufacturing system. When a substrate is placed on an end effector, the system controller can determine whether sufficient vacuum pressure is supplied to the space between the substrate and the end effector to adequately secure the substrate to the end effector (i.e., whether a vacuum grip applied to the object is adequate to prevent the object from moving so that the object does not fall or rotate during transport by the robot arm). By determining whether the vacuum pressure is sufficient, the system controller can identify an appropriate transport speed for the robot arm to transport the substrate within the manufacturing system without the substrate moving or rotating on the end effector and/or falling from the end effector. Accordingly, a fewer number of substrates can become unsecured during transport throughout the manufacturing system. Therefore, a fewer number of substrates can become damaged during transport and/or the end effector and/or other equipment of the manufacturing system can be less frequently damaged due to unsecured substrates. As the number of damaged substrates and/or equipment of the manufacturing system decreases, an overall throughput and efficiency of the manufacturing system increases and an overall latency of the manufacturing system decreases.

Figure 1:
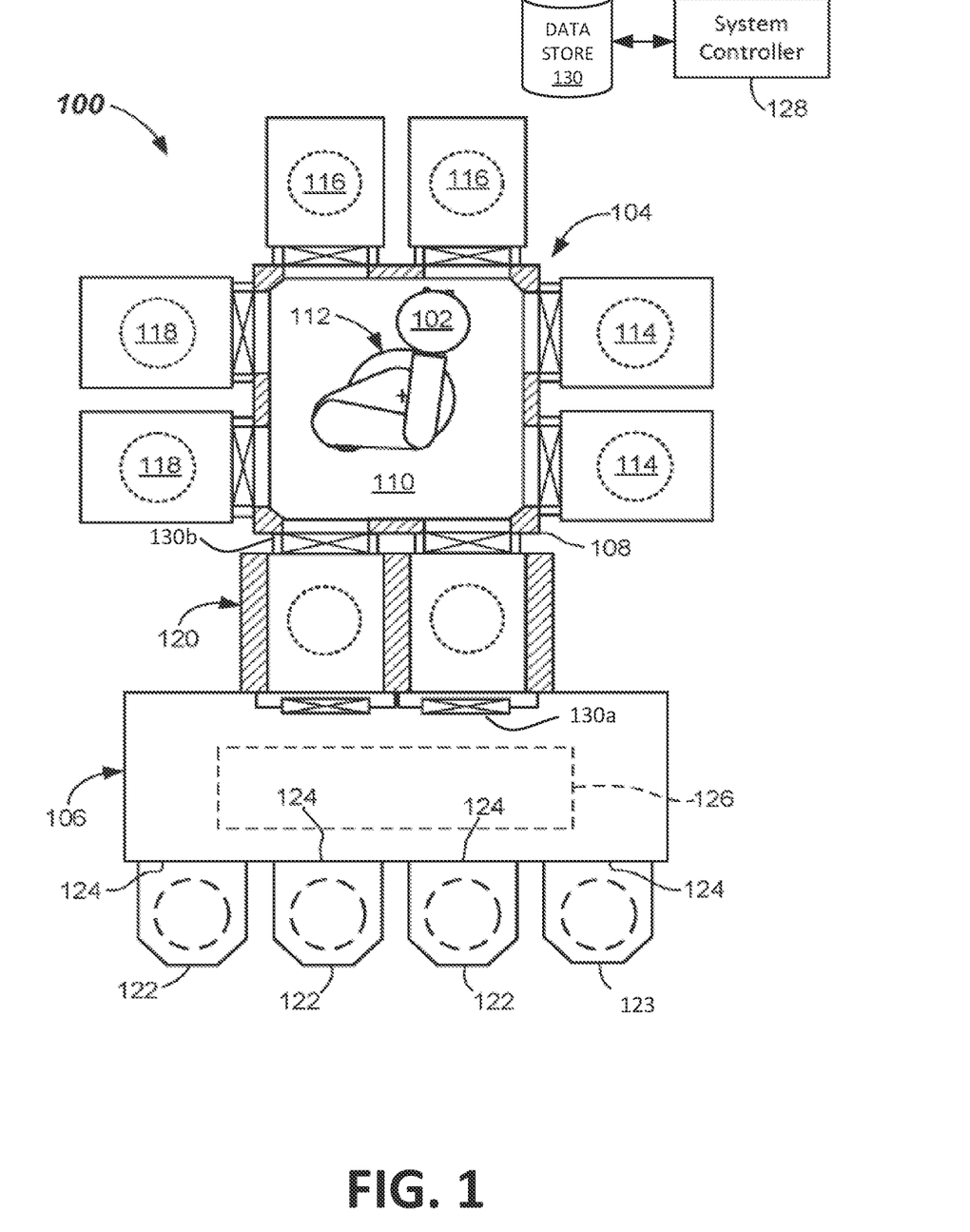
FIG. 1 is a top schematic view of an example manufacturing system, according to aspects of the present disclosure.

FIG. 1 is a top schematic view of an example manufacturing system, according to aspects of the present disclosure. Manufacturing system 100 can perform one or more processes on a substrate 102. Substrate 102 can be any suitably rigid, fixed-dimension, planar article, such as, e.g., a silicon-containing disc or wafer, a patterned wafer, a glass plate, a cover wafer, or the like, suitable for fabricating electronic devices or circuit components thereon. In some embodiments, substrate 102 can be a silicon-based substrate, a glass substrate, a glass bonded substrate, a substrate that includes reticles (e.g., lithography), and so forth. In additional or alternative embodiments, substrate 102 can be a bowed or warped substrate.

Manufacturing system 100 can include a process tool 104 and a factory interface 106 coupled to process tool 104. Process tool 104 can include a housing 108 having a transfer chamber 110 therein. Transfer chamber 110 can include one or more process chambers (also referred to as processing chambers) 114, 116, 118 disposed therearound and coupled thereto. Process chambers 114, 116, 118 can be coupled to transfer chamber 110 through respective ports, such as slit valves or the like.

Process chambers 114, 116, 118 can be adapted to carry out any number of processes on substrates 102. A same or different substrate process can take place in each process chamber 114, 116, 118. A substrate process can include atomic layer deposition (ALD), physical vapor deposition (PVD), chemical vapor deposition (CVD), etching, annealing, curing, pre-cleaning, metal or metal oxide removal, or the like. In one example, a PVD process can be performed in one or both of process chambers 114, an etching process can be performed in one or both of process chambers 116, and an annealing process can be performed in one or both of process chambers 118. Other processes can be carried out on substrates 102 therein. Process chambers 114, 116, 118 can each include a substrate support assembly. The substrate support assembly can be configured to hold substrate 102 in place while a substrate process is performed.

As described above, an etching process can be performed at one or more process chambers 114, 116, 118. As such, some process chambers 114, 116, 118 (such as etch chambers) can include process kits (also referred to as edge rings or process kit rings) that are placed at a surface of the substrate support assembly. In some embodiments, the process kits can occasionally undergo replacement. While replacement of a process kit in conventional systems includes disassembly of a process chamber 114, 116, 118 by an operator to replace the process kit, manufacturing system 100 can be configured to facilitate replacement of process kits without disassembly of a process chamber 114, 116, 118 by an operator.

In some embodiments, a process chamber 114, 116, 118 can include a carousel (also referred to as a susceptor). The carousel can be disposed in an interior volume of the process chamber 114, 116, 118 and can be configured to rotate about an axial center at the process chamber 114, 116, 118 during a process (e.g., a deposition process) to ensure process gases are evenly distributed. In some embodiments, one or more components of the carousel can be configured to handle one or more objects. For example, the carousel can include end effectors or other types of components that are configured to hold a substrate, a process kit, and/or a process kit carrier. One or more sensors can be disposed at the process chamber 114, 116, 118 and can be configured to detect a placement of an object on the carousel. In some embodiments, the carousel can include one or more vacuum grip pads that are connected to a vacuum pressure source (e.g., a vacuum pump) via one or more vacuum pressure lines, in accordance with embodiments of the present disclosure.

Transfer chamber 110 can also include a transfer chamber robot 112. Transfer chamber robot 112 can include one or multiple arms where each arm includes one or more end effectors at the end of each arm. The end effector can be configured to handle particular objects, such as substrates. Alternatively, or additionally, the end effector can be configured to handle process kits (e.g., using a process kit carrier). In some embodiments, transfer chamber robot 112 can be a selective compliance assembly robot arm (SCARA) robot, such as a 2 link SCARA robot, a 3 link SCARA robot, a 4 link SCARA robot, and so on.

A load lock 120 can also be coupled to housing 108 and transfer chamber 110. Load lock 120 can be configured to interface with, and be coupled to, transfer chamber 110 on one side and factory interface 106. Load lock 120 can have an environmentally-controlled atmosphere that can be changed from a vacuum environment (wherein substrates can be transferred to and from transfer chamber 110) to an inert-gas environment at or near atmospheric-pressure (wherein substrates can be transferred to and from factory interface 106) in some embodiments. In some embodiments, load lock 120 can be a stacked load lock having a pair of upper interior chambers and a pair of lower interior chambers that are located at different vertical levels (e.g., one above another). In some embodiments, the pair of upper interior chambers can be configured to receive processed substrates from transfer chamber 110 for removal from process tool 104, while the pair of lower interior chambers can be configured to receive substrates from factory interface 106 for processing in process tool 104. In some embodiments, load lock 120 can be configured to perform a substrate process (e.g., an etch or a pre-clean) on one or more substrates 102 received therein.

Factory interface 106 can be any suitable enclosure, such as, e.g., an Equipment Front End Module (EFEM). Factory interface 106 can be configured to receive substrates 102 from substrate carriers 122 (e.g., Front Opening Unified Pods (Fops)) docked at various load ports 124 of factory interface 106. A factory interface robot 126 (shown dotted) can be configured to transfer substrates 102 between substrate carriers (also referred to as containers) 122 and load lock 120. In other and/or similar embodiments, factory interface 106 can be configured to receive replacement parts (e.g., process kits) from replacement parts storage containers 123. Factory interface robot 126 can include one or more robot arms and can be or include a SCARA robot. In some embodiments, factory interface robot 126 can have more links and/or more degrees of freedom than transfer chamber robot 112. Factory interface robot 126 can include an end effector on an end of each robot arm. The end effector can be configured to pick up and handle specific objects, such as substrates or process kits. Alternatively, or additionally, the end effector can be configured to handle objects such as process kits (e.g., using process kit carriers).

Any conventional robot type can be used for factory interface robot 126. Transfers can be carried out in any order or direction. Factory interface 106 can be maintained in, e.g., a slightly positive-pressure non-reactive gas environment (using, e.g., nitrogen as the non-reactive gas) in some embodiments.

As indicated above, transfer chamber robot 112 and/or factory interface robot 126 can each include one or more robot arms, which each include one or more end effectors at the end of each arm. In some embodiments, a respective end effector of a robot arm can include one or more vacuum grip pads that are configured to provide vacuum pressure from a vacuum pressure source (e.g., a vacuum pump) via one or more vacuum supply lines. The vacuum grip pads can provide the vacuum pressure to secure an object (e.g., a substrate, a process kit, etc.) to the end effector (e.g., during transport of the object within system 100). The one or more vacuum supply lines can be connected to one or more pressure sensors (e.g., vacuum pressure sensors, etc.) which are configured to detect an amount of vacuum pressure provided from the vacuum pressure source to the vacuum grip pads, in some embodiments. In additional or alternative embodiments, a respective end effector can include a presence sensor, which is configured to detect a presence of a substrate or other object that is placed on the end effector. Further details regarding end effectors of system 100 are provided with respect to FIG. 2.

In some embodiments, transfer chamber 110, process chambers 114, 116, and 118, and load lock 120 can be maintained at a vacuum level. Manufacturing system 100 can include one or more vacuum ports that are coupled to one or more stations of manufacturing system 100. For example, first vacuum ports 130a can couple factory interface 106 to load locks 120. Second vacuum ports 130b can be coupled to load locks 120 and disposed between load locks 120 and transfer chamber 110.

Manufacturing system 100 can also include a system controller 128. System controller 128 can be and/or include a computing device such as a personal computer, a server computer, a programmable logic controller (PLC), a microcontroller, and so on. System controller 128 can include one or more processing devices, which can be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more special-purpose processing devices such as an application specific integrated circuit (ASIC), a field programmable gate array (FPGA), a digital signal processor (DSP), network processor, or the like. System controller 128 can include a data storage device (e.g., one or more disk drives and/or solid state drives), a main memory, a static memory, a network interface, and/or other components. System controller 128 can execute instructions to perform any one or more of the methodologies and/or embodiments described herein. The instructions can be stored on a computer readable storage medium, which can include the main memory, static memory, secondary storage and/or processing device (during execution of the instructions).

In some embodiments, system controller can include or be connected to a data store 130 (e.g., via a network). Data store 130 can be a memory (e.g., random access memory), a drive (e.g., a hard drive, a flash drive), a database system, or another type of component or device capable of storing data. Data store 130 can include multiple storage components (e.g., multiple drives or multiple databases) that may span multiple computing devices (e.g., multiple server computers). The data store 130 can store data associated with processing a substrate at manufacturing system 100, in accordance with embodiments described herein.

In one embodiment, system controller 128 can execute instructions to cause an end effector of a robot arm (e.g., of transfer chamber robot 112) to transport an object (i.e., a substrate 102 and/or a process kit) from a first station (e.g., load lock 120) of manufacturing system 100 to a second station (e.g., process chamber 114, 116, 118) of manufacturing system 100. In some embodiments, system controller 128 can detect that the object is placed on the end effector based on one or more signals received from a presence sensor of the end effector. Responsive to detecting the object is placed on the end effector, system controller 128 can cause the vacuum pressure source to generate and/or otherwise provide vacuum pressure to vacuum grip pads of the end effector via vacuum lines. The pressure sensor(s) connected to the one or more vacuum lines can measure an amount of vacuum pressure provided to the vacuum grip pads and can transmit one or more signals to system controller 128 indicating the measured amount of vacuum pressure. System controller 128 can determine a speed at which to transport the object via the end effector based on the measured amount of vacuum pressure. Further details regarding transporting an object within system 100 are provided with respect to FIGS. 3 and 4.

It should be noted that although some embodiments of the present disclosure are directed to transporting a substrate 102 within system 100, embodiments of the present disclosure can be applied to transporting any type of object (e.g., a process kit, a process kit carrier, a diagnostic wafer, a cover wafer, etc.) within system 100. It should also be noted that although some embodiments of the present disclosure are directed to transporting or moving a substrate via transfer chamber robot 112 and/or factory interface robot 126, embodiments of the present disclosure can be applied to other objects of system 100. For example, embodiments of the present disclosure can be applied to a carousel disposed within process chamber 114, 116, 118, and so forth.

Figure 2:
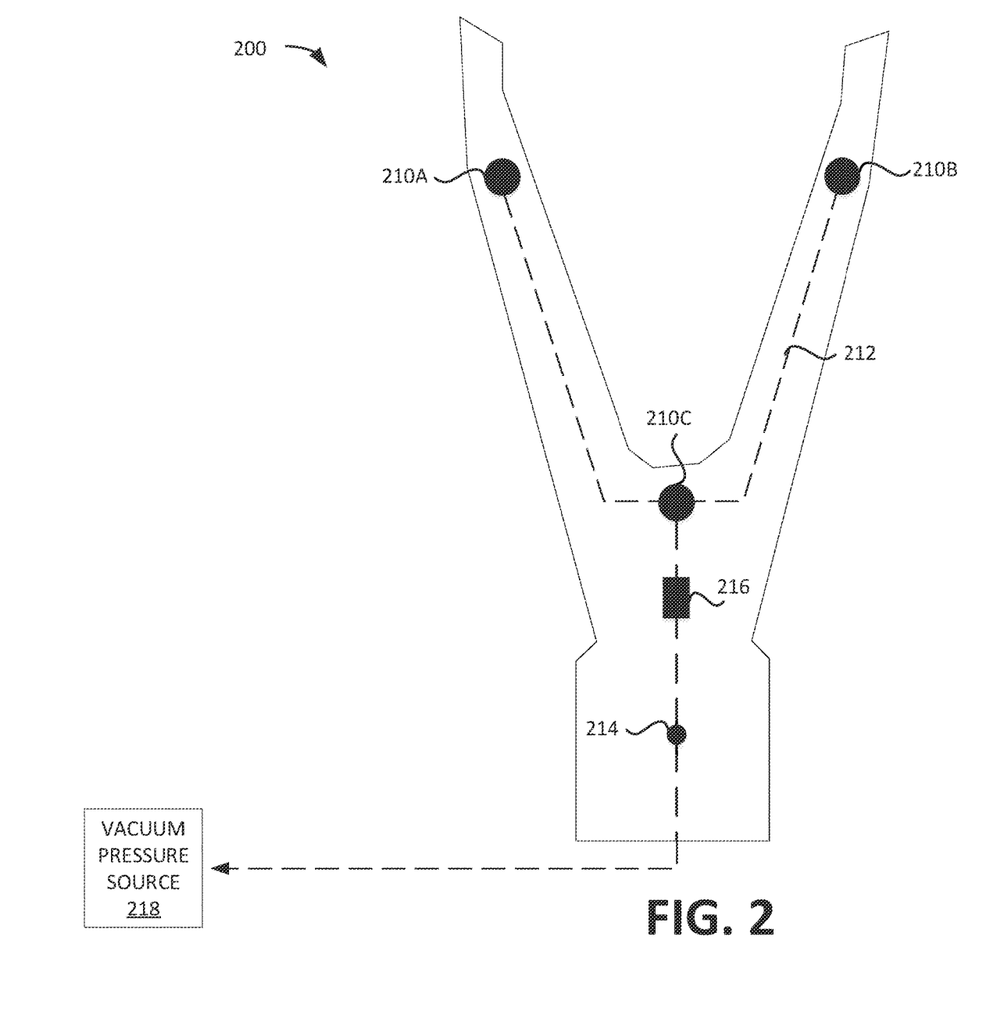
FIG. 2 illustrates an example end effector, according to aspects of the present disclosure.

FIG. 2 illustrates an example end effector 200, according to aspects of the present disclosure. In some embodiments, end effector 200 can correspond to an end effector of a robot arm of transfer chamber robot 112 described with respect to FIG. 1. In other or similar embodiments, end effector 200 can correspond to an end effector of a robot arm of factory interface robot 126. In yet other or similar embodiments, end effector 200 can correspond to an end effector of a carousel disposed within a process chamber 114, 116, 118.

End effector 200 can include one or more vacuum grip pads 210. A vacuum grip pad 210 can be configured to supply a vacuum pressure to a space between the end effector 200 and an object (e.g., substrate 102) placed or otherwise disposed on the end effector 200. The vacuum grip pad(s) 210 can be connected to a vacuum pressure source 218 (e.g., a vacuum pump) via one or more vacuum supply lines 212. In one example, each of the one or more vacuum grip pads 210 can include at least one opening that exposes the environment of the space between substrate 102 and the end effector 200 to the environment of the one or more vacuum supply lines 212 connected to the respective vacuum grip pad 210. The vacuum pressure source 218 can generate vacuum pressure, which can be provided through the supply lines 212 to the opening of a respective vacuum grip pad 210. The vacuum pressure provided to vacuum grip pad 210 can be provided to the space between substrate 102 and the end effector 200. The vacuum grip pad(s) 210 can also be configured to provide a seal (e.g., an air tight seal) between a portion of the substrate 102 that interfaces with the grip pad(s) 210 and the environment surrounding the substrate 102 (e.g., the environment of transfer chamber 110, process chamber 114, 115, 118, etc.), in some embodiments. In some embodiments, the vacuum grip pads 210 can be composed of one or more of a polyaryletherketone-based material, a polybenzimidazole-based material, a polyimide-based material, a polyethylene-based material, a perfluoroelastomer-based material, and so forth. It should be noted that although end effector 200 has three vacuum grip pads (e.g., vacuum grip pads 210A, 210B, and 210C), end effector 200 can include any number of vacuum grip pads 210.

In some embodiments, each vacuum grip pad 210 of end effector 200 can be connected to a single supply line 212 that is connected to vacuum pressure source 218, as illustrated in FIG. 2. In other or similar embodiments, each vacuum grip pad 210 can be connected to a respective supply line 212, and each supply line 212 can be connected to vacuum pressure source 218 (or to respective vacuum pressure sources 218). For example, vacuum grip pad 210a can be connected to a first supply line 212, vacuum grip pad 210b can be connected to a second supply line 212, and/or vacuum grip pad 210c can be connected to a third supply line 212. The first, second and/or third supply lines 212 can each be connected to a single vacuum pressure source 218, or can each be connected to distinct vacuum pressure sources 218. In some embodiments, vacuum supply line(s) 212 can be routed through a robot arm of robot 112 and/or robot 126. Vacuum pressure source 218 can be a component of robot 112 and/or robot 126, in some embodiments. In other or similar embodiments, vacuum pressure source 218 can be coupled or otherwise connected to robot 112 and/or robot 126.

In some embodiments, one or more pressure sensor(s) 214 can be configured to measure an amount of vacuum pressure provided to the vacuum grip pad(s) 210 via the vacuum supply line(s) 212. In some embodiments, the one or more pressure sensor(s) 214 can be vacuum pressure sensors. However, other types of pressure sensors can also be used (e.g., pressure switches, etc.). As described above, each vacuum grip pad 210 can be connected to a single supply line 212, in some embodiments. In such embodiments, one or more pressure sensor(s) 214 can be connected to the single supply line 212. The pressure sensor(s) 214 can measure the amount of vacuum pressure provided to each of the vacuum grip pads 210 connected to the single supply line 212. In other or similar embodiments, each vacuum grip pad 210 can be connected to a respective supply line 212, as described above. In such embodiments, one or more pressure sensor(s) 214 can be connected to each respective supply line and can measure the amount of vacuum pressure provided to each respective vacuum grip pad 210. Pressure sensor(s) 214 can be connected (e.g., via a network, etc.) to system controller 128. In response to measuring an amount of vacuum pressure provided to a respective vacuum grip pad 210, pressure sensor(s) 214 can transmit a signal to system controller 128 indicating the measured amount of vacuum pressure. In some embodiments, the measured amount of vacuum pressure provided to the vacuum grip pads can correspond to the amount of vacuum pressure provided to the space between end effector 200 and the object placed on end effector 200.

End effector 200 can include one or more presence sensors 216 that are configured to detect a presence of an object on end effector 200. In some embodiments, a presence sensor 216 can include a capacitance sensor, a thru-beam sensor, an optical sensor, a reflective sensor, a Halifax sensor, an ultrasonic sensor, a weight-based sensor, and so forth. The presence sensor(s) 216 can be connected to system controller 128 (e.g., via a network, etc.). In response to detecting that an object is placed on end effector 200, presence sensor(s) 216 can transmit a notification to system controller 128 indicating the presence of the object.

It should be noted that although FIG. 2 depicts a single presence sensor 216 of end effector 200, end effector 200 can include any number of presence sensors 216. It should also be noted that although FIG. 2 depicts pressure sensor(s) 214 and presence sensor(s) 216 as components of end effector 200, pressure sensor(s) 214 and/or presence sensor(s) 216 can be separate from end effector 200, in some embodiments. For example, presence sensor 216 can include a weight sensor that resides or is otherwise connected to robot 112 and/or robot 126, but may not be included on end effector 200. In another example, pressure sensor 214 can be included in a robot arm and/or a body of robot 112 and/or robot 126 instead of at end effector 200.

In some embodiments, end effector 200 can include one or more additional components to the components illustrated in FIG. 2. For example, end effector 200 can include one or more friction pads (not shown) that are configured to secure an object to end effector 200, in accordance with embodiments of the present disclosure. In some embodiments, the friction pads can secure the object to end effector 200 based on a frictional force between the object and the friction pads, as described herein. The friction pads can secure the object based on the frictional force in addition to or in place of vacuum grip pads.

Figure 3:
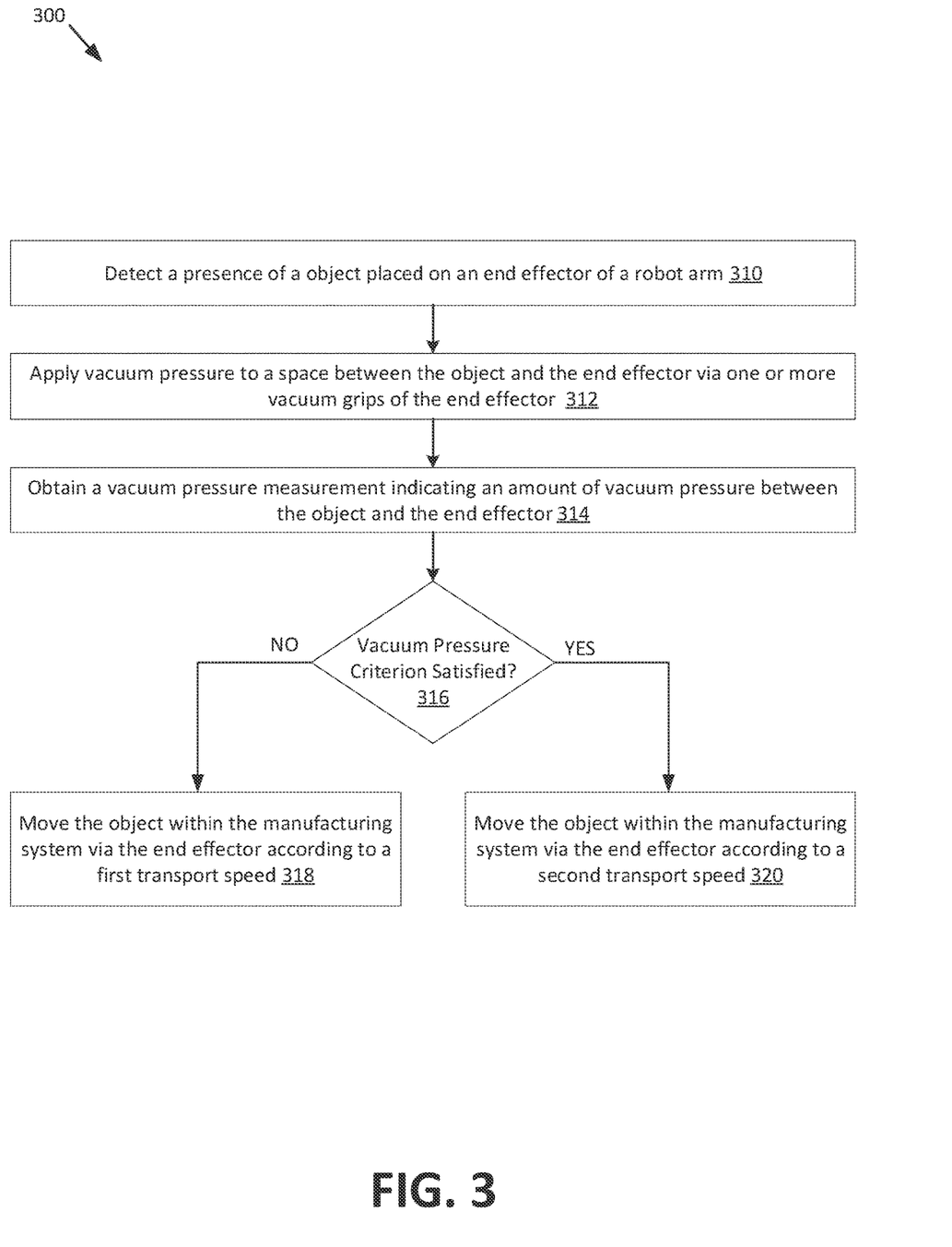
FIG. 3 is a flow chart of a method for transporting an object within a manufacturing system via an end effector of a robot arm, according to aspects of the present disclosure.
Figure 4:
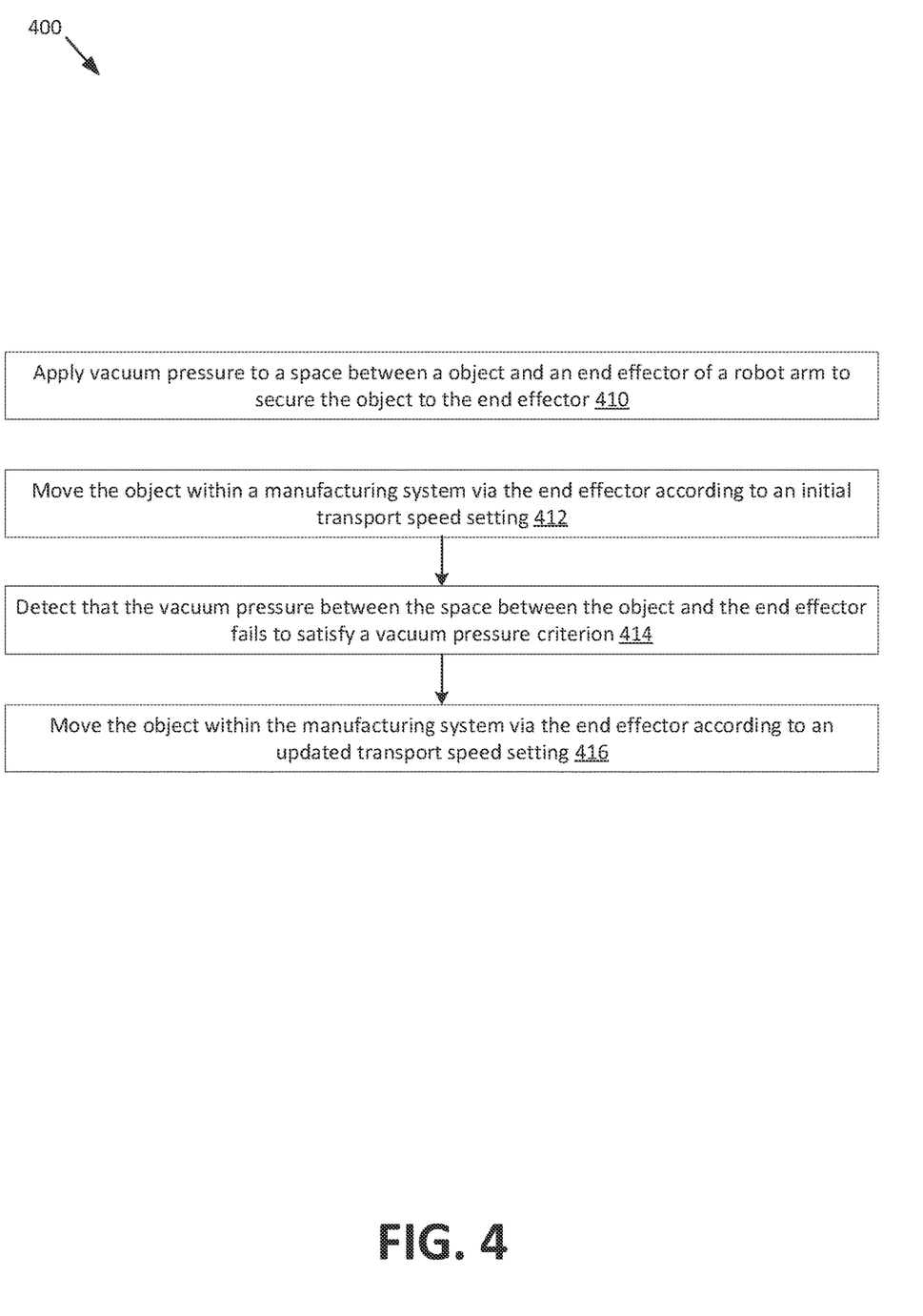
FIG. 4 is a flow chart of another method for transporting an object within a manufacturing system via an end effector of a robot arm, according to aspects of the present disclosure.

FIG. 3 is a flow chart of a method 300 for determining a speed for transporting an object within a manufacturing system via an end effector of a robot arm, according to aspects of the present disclosure. FIG. 4 is a flow chart of another method 400 for determining a speed for transporting an object within a manufacturing system via an end effector of a robot arm, according to aspects of the present disclosure. Methods 300 and 400 can be performed by processing logic that can include hardware (circuitry, dedicated logic, etc.), software (such as is run on a general purpose computer system or a dedicated machine), firmware, or some combination thereof. Some operations of methods 300 and 400 can be performed by a processing device, such as system controller 128 of FIG. 1.

For simplicity of explanation, methods 300 and 400 are depicted and described as a series of acts. However, acts in accordance with this disclosure can occur in various orders and/or concurrently, and with other acts not presented and described herein. Furthermore, not all illustrated acts can be performed to implement the methods in accordance with the disclosed subject matter. In addition, those skilled in the art will understand and appreciate that the methods could alternatively be represented as a series of interrelated states via a state diagram or events.

Referring now to FIG. 3, at block 310, processing logic (e.g., system controller 128) detects a presence of an object placed on an end effector of a robot arm. In some embodiments, the end effector can correspond to end effector 200 of FIG. 2. In some embodiments, system controller 128 can detect the presence of the object based on one or more signal received from a sensor (e.g., presence sensor 216) of or coupled to end effector 200. In one illustrative example, presence sensor 216 can be a thru-beam sensor. The thru-beam sensor can include a transmission component and a receiving component. The transmission component can be configured to transmit a beam (e.g., a light beam, etc.) to the receiving component. When an object is placed on end effector 200, the object can block the beam transmitted by the transmission component to the receiving component. The sensor can detect that the object is placed on the end effector 200 in response to detecting that the beam is blocked. Presence sensor 216 can include other types of sensors (e.g., weight sensor, capacitance sensor, Halifax sensor, etc.), as described above. It should be noted that, in some embodiments, presence sensor 216 can include an optical sensor (e.g., a camera, etc.). The optical sensor can be disposed within or outside of a station of manufacturing system 100 and can visually monitor a presence of an object placed on end effector 200.

At block 312, processing logic (e.g., system controller 128) applies vacuum pressure to a space between the object and the end effector via one or more vacuum grips of the end effector. As described above, end effector 200 can include vacuum grips, such as vacuum grips 210, which are connected to a vacuum pressure source 218 via one or more vacuum lines 212. System controller 128 can transmit a signal to vacuum pressure source 218 to cause vacuum pressure source 218 to generate vacuum pressure (e.g., by activating a vacuum pump, etc.). Vacuum grip pads 210 can receive the vacuum pressure via the vacuum line(s) 212 and can provide the vacuum pressure to the space between the object and end effector 200, as described above.

At block 314, processing logic (e.g., system controller 128) obtains a vacuum pressure measurement indicating an amount of vacuum pressure between the object and the end effector. In some embodiments, system controller 128 can obtain the vacuum pressure measurement from a pressure sensor (e.g., pressure sensor 214, described above). Pressure sensor 214 can measure the amount of vacuum pressure provided to one or more vacuum grip pads 210 of end effector 200 and transmit a signal indicating the measurement to system controller 128 (e.g., via a network). In some embodiments, pressure sensor 214 can automatically measure the amount of vacuum pressure (e.g., in response to vacuum pressure source 218 generating and providing the vacuum pressure). In other or similar embodiments, pressure sensor 214 can transmit a request to pressure sensor 214 for the measurement (e.g., with or responsive to transmitting the signal to vacuum pressure source 218 to provide the vacuum pressure).

At block 316, processing logic (e.g., system controller 128) determines whether the obtained vacuum pressure measurement satisfies a vacuum pressure criterion. In some embodiments, the vacuum pressure criterion can include a threshold vacuum pressure. The threshold vacuum pressure can correspond to an amount of vacuum pressure provided to the space between the object and end effector 200 that is determined or otherwise known to be sufficient to secure the object to end effector 200. In some embodiments, system controller 128 can determine the threshold vacuum pressure based on historical data associated with the manufacturing system. For example, for a set of objects transported by end effector 200 (or another end effector of system 100), system controller 128 can store (e.g., in a data store) an indication of the amount of vacuum pressure that was provided to the space between each of the set of objects and the end effector 200 before and/or during transport. System controller 128 can also store an indication of whether each respective object was adequately secured to the end effector 200 during the transport (e.g., whether the object moved or fell from the end effector 200 before, during, and/or after the transport). System controller 128 can determine, based on such data, a minimum amount of vacuum pressure that is to be applied to the space between an object and end effector 200 (e.g., by identifying the lowest amount of applied vacuum pressure that enabled an object to be secured to the end effector 200, etc.). The determined minimum amount of vacuum pressure can correspond to the threshold vacuum pressure. In other or similar embodiments, a user of system 100 (e.g., an operator, a developer, a technician, etc.) can provide an indication of the threshold vacuum pressure to system controller 128 (e.g., via a client device connected to system controller 128 via a network, etc.).

In response to processing logic determining that the obtained vacuum pressure measurement does not satisfy the vacuum pressure criterion, method 300 proceeds to block 318. In some embodiments, processing logic can determine that the obtained vacuum pressure measurement does not satisfy the vacuum pressure criterion by determining that the obtained vacuum pressure measurement does not meet or satisfy (e.g., falls below) the threshold vacuum pressure. In response to processing logic determining that the obtained vacuum pressure measurement satisfies the vacuum pressure criterion, method 300 proceeds to block 320. In some embodiments, processing logic can determine that the obtained vacuum pressure measurement satisfies the vacuum pressure criterion by determining that the obtained vacuum pressure measurement meets or satisfies the threshold vacuum pressure.

At block 318, processing logic (e.g., system controller 128) moves the object within the manufacturing system via the end effector according to a first transport speed setting. As indicated above, system controller 128 can determine that the obtained vacuum pressure measurement does not satisfy the vacuum pressure criterion in response to determining the obtained vacuum pressure measurement does not meet or exceed the threshold vacuum pressure associated with adequately securing the object to the end effector. Accordingly, the first transport speed setting can correspond to a first transport speed that is slow enough such that the object is secured to the end effector based on a frictional force between the object and the one or more vacuum grip pads. In some embodiments, system controller 128 can determine the first transport speed based on a transport speed data structure. The transport speed data structure can include one or more entries that each include a mapping between a material type for an object, a material type for a vacuum grip pad, and a speed for transporting the object via the end effector.

Data included in each entry of the transport speed data structure can be provided based on experimental and/or test data associated with one or more historical objects transported within system 100. In one example, system controller 128 (or another controller associated with system 100) can transport an object between stations of system 100 via end effector 200 at differing transport speeds. In some instances, the object can be secured to end effector 200 via vacuum grip pads 210. In other instances, the object can be partially secured to end effector 200 via vacuum grip pads 210 (e.g., secured by at least one grip pad but not all grip pads 210 of end effector 200), or can be unsecured to end effector 200 via vacuum grip pads 210. A user of system 100 (e.g., an operator, a technician, a developer, etc.) can provide an indication of the type of material of which the object is composed and/or a type of material of which the vacuum grip pads are composed (e.g., via a client device connected to system controller 128). In some embodiments, system controller 128 can determine, for each transport speed used to transport the object, whether the object moved (e.g., slid, rotated) or fell from the end effector during transport. For example, the user can provide (e.g., via the client device) an indication of whether the object moved, slid, or fell from the end effector during transport. In another example, one or more optical components (e.g., cameras) of the manufacturing system can monitor an environment at which the object is being transported and can transmit an indication to system controller 128 indicating whether motion associated with the object was detected by the components during transport. System controller 128 can identify the fastest transport speed of the differing transport speeds at which motion was not detected for the object during transport (e.g., the object was stationary on the end effector 200 during transport). System controller 128 can store the identified transport speed, as well as the indication of the material types for the object and the vacuum grip pads in an entry of the transport speed data structure. It should be noted that although embodiments of the present disclosure are directed to system controller 128 facilitating a transport speed experiment, other components at or coupled to system 100 can facilitate the transport speed experiment, or other transport speed experiments and can provide the corresponding experimental data to system controller 128.

System controller 128 can determine the first transport speed setting by determining a material type of the object and a material type of the vacuum grip pads. In some embodiments, system controller 128 can determine the material types based on a notification received from a user of the system (e.g., via the client device). In other or similar embodiments, system controller 128 can identify a portion of memory associated with system 100 (e.g., a data store, etc.) that includes an indication of the type of material associated with the object and the vacuum grip pads and can obtain the material types from the identified portion of memory. Responsive to determining the material type of the object and the material type of the vacuum grip pads, the system controller 128 can identify an entry of the transport speed data structure that corresponds to the determined material types and can extract the first transport speed setting from the identified entry.

In other or similar embodiments, system controller 128 can determine the first transport speed setting based on an estimated frictional force associated with the object and the vacuum grip pads. In some embodiments, the system controller 128 can determine the estimated frictional force based on a coefficient of friction between the object and the vacuum grip pads. A coefficient of friction refers to a ratio of frictional force resisting the motion of two surfaces in contact. The coefficient of friction associated with the object and the vacuum grip pads can be dependent on the type of material of which the object is composed, the type of material of which the vacuum grip pads are composed, and the weight of the object. The system controller 128 can determine the materials of the object and the vacuum grip pads, as indicated above, and can determine the weight of the object. In some embodiments, the system controller 128 can determine the weight of the object by accessing a database or other type of data structure that indicates the weight (or approximate weight) for one or more objects associated with system 100. In other or similar embodiments, the system controller 128 can determine the weight of the object based on a signal from a weight sensor associated with end effector 200, as described above. System controller 128 can determine the coefficient of friction based on the determined material types of the object and the vacuum grip pads 210 and the determined weight of the object. In some embodiments, system controller 128 can determine the first transport speed setting based on the determined coefficient of friction. In one example, system controller 128 can determine the first transport speed by calculating, for a set of transport speeds, an amount of motion (e.g., sliding motion, rotational motion, etc.) that would occur by the object on the end effector 200 if the end effector 200 is moved at the respective transport speed, in view of the determined coefficient of friction. System controller 128 can select the transport speed that is associated with zero motion (or approximately zero motion) or the least amount of motion as the first transport speed.

Responsive to determining the first transport speed setting, system controller 128 can cause the robot arm including end effector 200 to move according to the first transport speed setting. The first transport speed setting can cause the end effector to move the object at a first transport speed that is slow enough such to secure the object to the end effector via a frictional force between the object and the vacuum grip pads 210.

As indicated above, in response to processing logic determining that the obtained vacuum pressure measurement satisfies the vacuum pressure criterion, method 300 proceeds to block 320. At block 320, processing logic moves the object within the manufacturing system via the end effector according to a second transport speed. System controller 128 can determine that the obtained vacuum pressure measurement satisfies the vacuum pressure criterion in response to determining the obtained vacuum pressure measurement meets or exceeds the threshold vacuum pressure associated with adequately securing the object to the end effector. Accordingly, the system controller 128 can determine that the object is adequately secured to end effector 200. The second transport speed setting can be associated with a second transport speed that is faster than the first transport speed. In some embodiments, the second transport speed setting can correspond to a default transport speed associated with system 100.

As described previously, FIG. 4 is a flow chart of a method 400 for determining a speed for transporting an object within a manufacturing system via an end effector of a robot arm, according to aspects of the present disclosure. At block 410, processing logic (e.g., system controller 128) applies vacuum pressure to a space between an object and an end effector of a robot arm to secure the object to the end effector. System controller 128 can apply the vacuum pressure in accordance with previously described embodiments. At block 412, processing logic (e.g., system controller 128) moves the object within a manufacturing system via the end effector according to an initial transport speed setting. In some embodiments, the initial transport speed setting can correspond to a default setting associated with system 100 (e.g., the second transport speed described with respect to FIG. 3).

At block 414, processing logic (e.g., system controller 128) detects that the vacuum pressure between the space between the object and the end effector fails to satisfy a vacuum pressure criterion. In some embodiments, system controller 128 can receive a signal from a pressure sensor (e.g., pressure sensor 214) associated with end effector 200 indicating a measured amount of vacuum pressure provided to the space between the object and end effector 200. System controller 128 can determine that the measured amount of vacuum pressure fails to satisfy the vacuum pressure criterion, in accordance with previously described embodiments. As indicating above, failing to satisfy the vacuum pressure criterion can indicate that the object is not adequately secured to the end effector 200.

At block 416, processing logic moves the object within the manufacturing system via the end effector according to an updated transport speed setting. The updated transport speed setting can correspond to a transport speed that is slow enough such that the object is secured to the end effector based on the frictional force between the object and the end effector 200 (e.g., first transport speed of FIG. 3). System controller 128 can determine the updated transport speed setting, in accordance with previously described embodiments. The updated transport speed can be slower than the initial transport speed.

Figure 5:
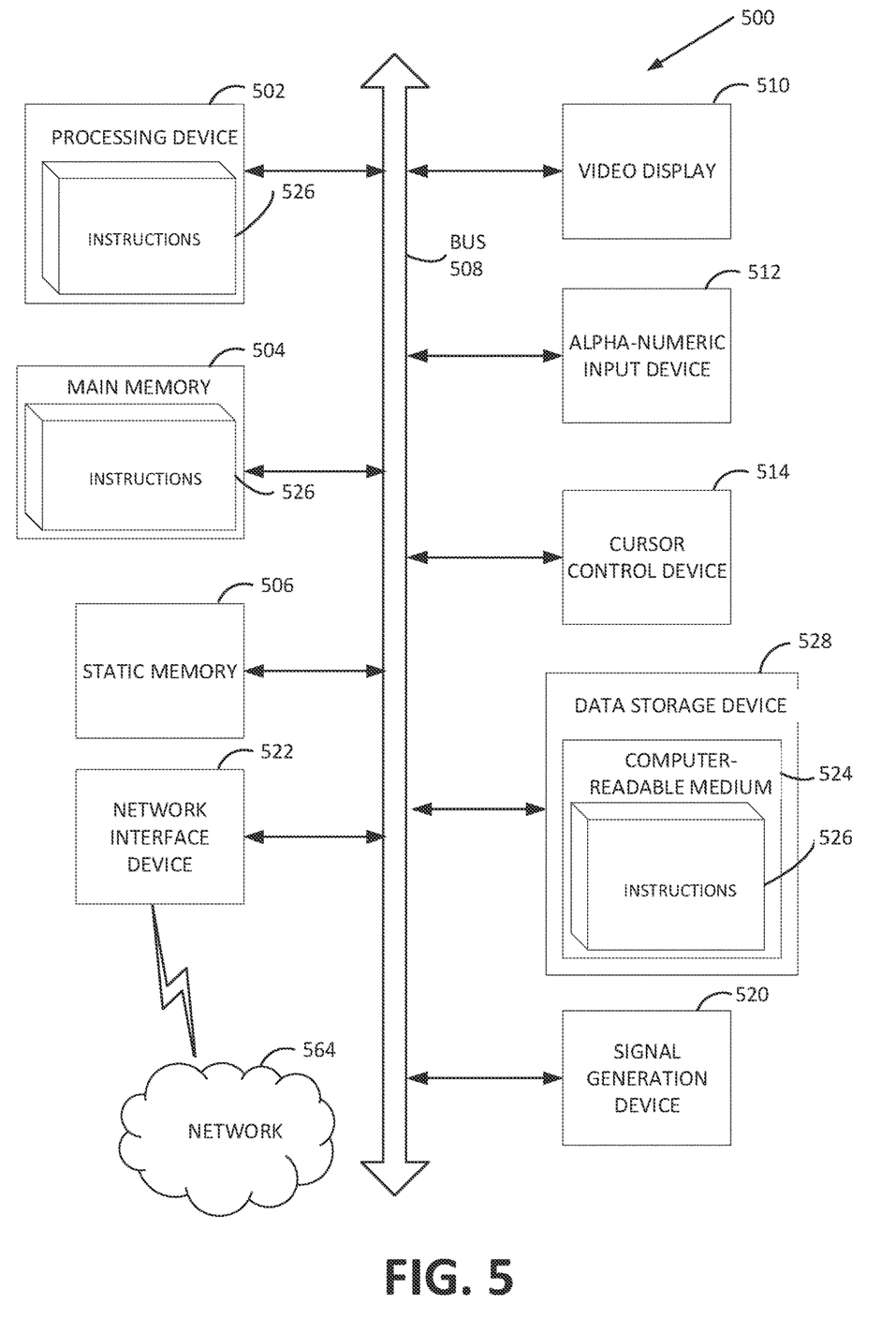
FIG. 5 illustrates a diagrammatic representation of a machine in the example form of a computing device within which a set of instructions for causing the machine to perform any one or more of the methodologies discussed herein can be executed.

FIG. 5 illustrates a diagrammatic representation of a machine in the example form of a computing device within which a set of instructions for causing the machine to perform any one or more of the methodologies discussed herein can be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet computer, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In embodiments, computing device 500 may correspond to system controller 128 of FIG. 1.

The example computing device 500 includes a processing device 502, a main memory 504 (e.g., read-only memory (ROM), flash memory, dynamic random access memory (DRAM) such as synchronous DRAM (SDRAM), etc.), a static memory 506 (e.g., flash memory, static random access memory (SRAM), etc.), and a secondary memory (e.g., a data storage device 528), which communicate with each other via a bus 508.

Processing device 502 may represent one or more general-purpose processors such as a microprocessor, central processing unit, or the like. More particularly, the processing device 502 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 502 may also be one or more special-purpose processing devices such as an application specific integrated circuit (ASIC), a field programmable gate array (FPGA), a digital signal processor (DSP), network processor, or the like. Processing device 502 may also be or include a system on a chip (SoC), programmable logic controller (PLC), or other type of processing device. Processing device 502 is configured to execute the processing logic (instructions 526) for performing operations and steps discussed herein.

The computing device 500 may further include a network interface device 522 for communicating with a network 564. The computing device 500 also may include a video display unit 510 (e.g., a liquid crystal display (LCD) or a cathode ray tube (CRT)), an alphanumeric input device 512 (e.g., a keyboard), a cursor control device 514 (e.g., a mouse), and a signal generation device 520 (e.g., a speaker).

The data storage device 528 may include a machine-readable storage medium (or more specifically a non-transitory computer-readable storage medium) 524 on which is stored one or more sets of instructions 526 embodying any one or more of the methodologies or functions described herein. Wherein a non-transitory storage medium refers to a storage medium other than a carrier wave. The instructions 526 may also reside, completely or at least partially, within the main memory 504 and/or within the processing device 502 during execution thereof by the computer device 500, the main memory 504 and the processing device 502 also constituting computer-readable storage media.

The computer-readable storage medium 524 may also be used to store instructions 526. The computer readable storage medium 524 may also store a software library containing methods that call instructions 526. While the computer-readable storage medium 524 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing or encoding a set of instructions for execution by the machine and that cause the machine to perform any one or more of the methodologies of the present disclosure. The term "computer-readable storage medium" shall accordingly be taken to include, but not be limited to, solid-state memories, and optical and magnetic media.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method may be altered so that certain operations may be performed in an inverse order so that certain operations may be performed, at least in part, concurrently with other operations. In another embodiment, instructions or sub-operations of distinct operations may be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A manufacturing system comprising:
   a robot arm comprising an end effector, wherein the robot arm is configured to transport objects within the manufacturing system; and
   a controller operatively coupled to the robot arm, wherein the controller is to:
     detect a presence of an object placed on the end effector of the robot arm;
     apply vacuum pressure to a space between the object and the end effector via one or more vacuum grip pads of the end effector, wherein the vacuum pressure is applied to secure the object to the end effector;
     obtain, by one or more pressure sensors of the robot arm, a vacuum pressure measurement indicating an amount of vacuum pressure between the object and the end effector;
     determine whether the obtained vacuum pressure measurement satisfies a vacuum pressure criterion;
     responsive to determining that the obtained vacuum pressure measurement does not satisfy the vacuum pressure criterion, identify a transport speed setting for transporting the object using the robot arm based on a frictional force associated with the object and the end effector, the frictional force determined based on at least a weight of the object, a material of the object, and a material of the vacuum grip pads; and
     cause the robot arm to move the object according to the transport speed setting.

2. The manufacturing system of claim 1, wherein to identify the transport speed setting the controller is configured to:
   determine a first transport speed setting corresponding to a first transport speed such that the object is secured to the end effector based on the frictional force between the object and the end effector.

3. The manufacturing system of claim 1, wherein the controller is further configured to:
   responsive to determining that the obtained vacuum pressure measurement satisfies the vacuum pressure criterion, identify the transport speed setting for transporting the object using the robot arm based on a default transport speed associated with the robot arm.

4. The manufacturing system of claim 1, wherein the material of the object comprises a silicon-based material.

5. The manufacturing system of claim 1, wherein to determine whether the obtained vacuum pressure measurement satisfies the vacuum pressure criterion, the controller is configured to:
   determine whether the obtained vacuum pressure measurement exceeds a vacuum pressure measurement threshold,
   wherein the obtained vacuum pressure measurement is determined to satisfy the vacuum pressure criterion responsive to the obtained vacuum pressure measurement exceeding the vacuum pressure measurement threshold.

6. The manufacturing system of claim 1, wherein the controller is configured to detect the presence of the object placed based on one or more readings by a presence sensor of the end effector, wherein the presence sensor comprises at least one of a thru-beam sensor, an optical sensor, a reflective sensor, a capacitance sensor, a Halifax sensor, an ultrasonic sensor, or a weight-based sensor.

7. The manufacturing system of claim 1, wherein the object comprises at least one of a substrate, a process kit ring, a process kit ring carrier, a diagnostic wafer, or a cover wafer.

8. The manufacturing system of claim 1, wherein the material of the one or more vacuum grip pads comprises at least one of a polyaryletherketone-based material, a polybenzimidazole-based material, a polyimide-based material, a polyethylene-based material, or a perfluoroelastomer-based material.

9. The manufacturing system of claim 1, further comprising:
   determining the weight of the object based on one or more readings of a weight sensor of the robot arm.

10. A method comprising:
    detecting a presence of an object placed on an end effector of a robot arm;
    applying vacuum pressure to a space between the object and the end effector via one or more vacuum grip pads of the end effector, wherein the vacuum pressure is applied to secure the object to the end effector;
    obtaining, by one or more pressure sensors of the robot arm, a vacuum pressure measurement indicating an amount of vacuum pressure between the object and the end effector;
    determining whether the obtained vacuum pressure measurement satisfies a vacuum pressure criterion;
    responsive to determining that the obtained vacuum pressure measurement does not satisfy the vacuum pressure criterion, identifying a transport speed setting for transporting the object using the robot arm based on a frictional force associated with the object and the end effector, the frictional force determined based on at least a weight of the object, a material of the object, and a material of the vacuum grip pads; and
    causing the robot arm to move the object according to the transport speed setting.

11. The method of claim 10, wherein identifying the transport speed setting comprises:
    determining a first transport speed setting corresponding to a first transport speed that such that the object is secured to the end effector based on the frictional force between the object and the end effector.

12. The method of claim 10, wherein determining the transport speed setting comprises:
responsive to determining that the obtained vacuum pressure measurement satisfies the vacuum pressure criterion, identifying the transport speed setting for transporting the object using the robot arm based on a default transport speed associated with the robot arm.

13. The method of claim 10, wherein the material of the object comprises a silicon-based material.

14. The method of claim 10, wherein determining whether the obtained vacuum pressure measurement satisfies the vacuum pressure criterion comprises:
determining whether the obtained vacuum pressure measurement exceeds a vacuum pressure measurement threshold,
wherein the obtained vacuum pressure measurement is determined to satisfy the vacuum pressure criterion responsive to the obtained vacuum pressure measurement exceeding the vacuum pressure measurement threshold.

15. The method of claim 10, wherein the presence of the object is detected based on one or more readings by a presence sensor of the end effector, wherein the presence sensor comprises at least one of a thru-beam sensor, an optical sensor, a reflective sensor, a capacitance sensor, a Halifax sensor, an ultrasonic sensor, or a weight-based sensor.

16. The method of claim 10, wherein the material of the one or more vacuum grip pads comprises at least one of a polyaryletherketone-based material, a polybenzimidazole-based material, a polyimide-based material, a polyethylene-based material, or a perfluoroelastomer-based material.

17. The method of claim 10, further comprising:
determining the weight of the object based on one or more readings of a weight sensor of the robot arm.

18. A robot arm for a manufacturing system, comprising:
an end effector, comprising:
one or more vacuum grip pads configured to apply a vacuum to a space between the vacuum grip pads and an object to secure the object to the end effector; and
a detector to detect a presence of the object on the end effector, wherein the detector comprises at least one of an optical sensor or a capacitance sensor;
a pressure sensor to measure a pressure of the space between the one or more vacuum grip pads and the object; and
a weight sensor to measure a weight of the object on the end effector,
wherein the robot arm is configured to move according to a first motion profile responsive to the pressure of the space between the vacuum grip pads and the object satisfying a pressure criterion and to move according to a second motion profile responsive to the pressure of the space between the vacuum grip pads and the object failing to satisfy the pressure criterion wherein the second motion profile is based on at least the weight of the object on the end effector, a material of the object, and a material of the one or more vacuum grip pads.

19. The robot arm of claim 18, wherein the end effector further comprises one or more friction grip pads configured to contact the object to secure the object.

20. The robot arm of claim 18, wherein the first motion profile corresponds to a first transport speed and the second motion profile corresponds to a second transport speed, wherein the second transport speed is such that the object is secured to the end effector based on a frictional force between the object and the end effector.

* * * * *